(12) United States Patent
Abe

(10) Patent No.: US 8,741,059 B2
(45) Date of Patent: Jun. 3, 2014

(54) SINGLE-CRYSTAL MANUFACTURING APPARATUS AND METHOD FOR MANUFACTURING SINGLE CRYSTAL

(75) Inventor: Takao Abe, Annaka (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 972 days.

(21) Appl. No.: 12/866,402

(22) PCT Filed: Feb. 17, 2009

(86) PCT No.: PCT/JP2009/000626
§ 371 (c)(1),
(2), (4) Date: Aug. 5, 2010

(87) PCT Pub. No.: WO2009/118993
PCT Pub. Date: Oct. 1, 2009

(65) Prior Publication Data
US 2010/0319610 A1 Dec. 23, 2010

(30) Foreign Application Priority Data

Mar. 24, 2008 (JP) ................................. 2008-075611

(51) Int. Cl.
*C30B 15/02* (2006.01)
(52) U.S. Cl.
USPC .................. 117/17; 117/35; 117/53; 117/932
(58) Field of Classification Search
USPC ........................................ 117/53, 932, 35, 17
See application file for complete search history.

(56) References Cited

U.S. PATENT DOCUMENTS

| 6,117,402 A * | 9/2000 | Kotooka et al. ............ 422/245.1 |
| 6,858,076 B1 | 2/2005 | Nakajima et al. |

(Continued)

FOREIGN PATENT DOCUMENTS

| JP | A-09-235173 | 9/1997 |
| JP | A-2001-278694 | 10/2001 |

(Continued)

OTHER PUBLICATIONS

International Search Report in International Application No. PCT/JP2009/000626, dated May 26, 2009.

(Continued)

*Primary Examiner* — Bob M Kunemund
(74) *Attorney, Agent, or Firm* — Oliff PLC

(57) ABSTRACT

According to the present invention, there is provided a single-crystal manufacturing apparatus based on Czochralski method, comprising at least: a main chamber configured to accommodate hot zone components including a crucible; and a pull chamber configured to accommodate and take out a single crystal pulled from a raw material melt contained in the crucible, wherein the apparatus further comprises: a cooling pipe which is arranged above the crucible and in which a cooling medium is circulated; and a moving mechanism that moves up and down the cooling pipe, and the hot zone components are cooled down by utilizing the moving mechanism to move down the cooling pipe toward the crucible after growth of the single crystal, and a method for manufacturing a single crystal is also provided. As a result, there can be provided the single crystal manufacturing apparatus and the method for manufacturing a single crystal that enable cooling the hot zone components in the main chamber in a short time after pulling a single crystal having a large diameter, e.g., approximately 200 mm or above.

11 Claims, 5 Drawing Sheets

(56) References Cited

U.S. PATENT DOCUMENTS

| | | |
|---|---|---|
| 7,141,113 B1 | 11/2006 | Nakamura et al. |
| 2003/0010276 A1 | 1/2003 | Abe et al. |
| 2003/0070605 A1 | 4/2003 | Hoshi et al. |
| 2005/0268840 A1* | 12/2005 | Inagaki et al. ............ 117/13 |
| 2008/0311021 A1* | 12/2008 | Inagaki et al. ............ 423/349 |
| 2009/0173272 A1* | 7/2009 | Inagaki et al. ............ 117/35 |
| 2009/0229512 A1 | 9/2009 | Kamogawa et al. |

FOREIGN PATENT DOCUMENTS

| | | |
|---|---|---|
| JP | A-2002-201090 | 7/2002 |
| JP | A-2007-091493 | 4/2007 |
| JP | A-2007-314375 | 12/2007 |
| WO | WO 01/57293 A1 | 8/2001 |
| WO | WO 2007/037052 A1 | 4/2007 |

OTHER PUBLICATIONS

Office Action issued in Japanese Patent Application No. 2008-075611 issued Oct. 9, 2012 (with partial translation).

International Preliminary Report on Patentability for International Patent Application No. PCT/JP2009/000626, mailed on Nov. 18, 2010.

May 3, 2012 Office Action issued in Chinese Patent Application No. 200980109099.6 (with partial translation).

* cited by examiner

SINGLE-CRYSTAL MANUFACTURING APPARATUS AND METHOD FOR MANUFACTURING SINGLE CRYSTAL

TECHNICAL FIELD

The present invention relates to a single-crystal manufacturing apparatus and a method for manufacturing a single crystal that can pull up a single crystal having a large diameter, e.g., a diameter of approximately 200 mm (8 inches) or above by Czochralski method (which will be also referred to as CZ method hereinafter) and then cool a hot zone component.

BACKGROUND ART

In recent years, to improve performance and reduce a manufacturing cost of a semiconductor device such as a solar cell or an MOS (Metal Oxide Semiconductor) transistor, an increase in diameter of a wafer formed of, e.g., silicon that is used as a substrate has advanced. Therefore, a single-crystal ingot which is grown by, e.g., CZ method and has a diameter of 200 mm (8 inches) or a diameter of 300 mm (12 inches) is manufactured, and an increase in diameter and an increase in weight advance.

Such a single-crystal ingot is manufactured by, e.g., a single-crystal manufacturing apparatus depicted in FIG. 2. FIG. 2 is a schematic view showing a general single-crystal manufacturing apparatus used in CZ method.

This general single-crystal manufacturing apparatus 20 is an apparatus for growing a single crystal 31 from a raw material melt 30 based on CZ method, and it is configured to accommodate in a main chamber 21a crucible 23 that contains the raw material melt 30 obtained by melting a polycrystal raw material, a heater 25 provided around the crucible 23, and a heat insulating material 26 provided around the heater 25.

In particular, components like the crucible 23, the heater 25 and the heat insulating material 26 that are heated are called hot zone components.

A pull chamber 22 configured to accommodate and take out a pulled single crystal 31 is connected to an upper end of the main chamber 21. Further, a gate valve 28 that opens/closes an opening portion at the upper end of the main chamber 21 is provided between the upper end portion of the main chamber 21 and the pull chamber 22. Furthermore, a single-crystal pulling mechanism (not shown) configured to wind up a wire 34 having a seed holder 33 attached at an end thereof is provided above the pull chamber 22.

To use such a single-crystal manufacturing apparatus 20 to manufacture the single crystal 31, a seed crystal 32 is held at an end of the seed holder 33, and the seed crystal 32 is immersed in the raw material melt 30 and gently pulled upward while rotating to grow the rod-like single crystal 31.

At this time, an inert gas such as Ar is circulated in the chamber while performing vacuum evacuation to discharge an oxide vaporized from a melt surface.

When pulling the single crystal is finished, the heater is turned off, the gate valve is closed, and the single crystal accommodated in the pull chamber is taken out. Further, after the hot zone components are cooled down, a pressure in the chamber is restored to a normal pressure, and then the hot zone components in the main chamber are dismantled. When the dismantlement of the hot zone components is finished, cleaning, replacement and others are carried out, then the hot zone components are again assembled, assembling the chambers, putting the raw material, vacuuming and melting a polycrystal raw material are carried out, and a single crystal is again pulled up.

In such manufacture of the single crystal based on CZ method, to achieve an improvement in productivity and a reduction in cost, an increase in single-crystal growth rate is regarded as one large means to make many improvements in conventional examples. However, an operation cycle of manufacture of a single crystal based on CZ method includes pulling the single crystal and the above many steps other than the pulling, and further greatly reducing a pulling time is difficult under existing circumstances. Therefore, it is considered that reducing a process time for the steps other than the pulling of the single crystal is effective for improving an operation efficiency, i.e., for improving an operating rate of the single-crystal manufacturing apparatus to raise productivity.

Except for the single crystal pulling step, proportions of melting of the raw material polycrystal before pulling the single crystal and a cooling time of the hot zone components are high. The cooling time of the hot zone components is determined based on a condition that carbon members such as the heater are cooled down so that they are not degraded even though they are in contact with oxygen in air when restoring a pressure in the main chamber to a normal pressure. Even in case of manufacture of a single crystal having a diameter of 200 mm (8 inches) and a straight body length of 1 m which is the current mainstream, this cooling time reaches approximately 8 hours in natural cooling, and it takes a little less than a half of the process time of the steps other than the pulling.

The cooling time of the hot zone components is precisely an idle period of the single-crystal manufacturing apparatus. Therefore, this cooling time eventually becomes a cause of a considerable reduction in operating rate of the single-crystal manufacturing apparatus. A demand for an increase in diameter of the single crystal shows no sign of slowing down, and manufacture of a large single crystal having a diameter of 300 mm (12 inches) or above is often carried out. In this case, a heat capacity of each hot zone component is greatly increased beyond a current capacity, and the cooling time is thereby prolonged, and a reduction in operating rate of the apparatus due to prolongation of the cooling time becomes a more serious problem.

A pamphlet of International Publication No. WO 01/057293 discloses a configuration that a cooling cylinder and a cooling auxiliary member configured to cool a single crystal immediately after pulling are arranged to surround the pulled single crystal. However, since the cooling cylinder is apart from a raw material melt remaining in a crucible, this configuration hardly contributes to a reduction in cooling time of each hot zone component after end of pulling the single crystal.

Furthermore, in Japanese Patent Application Laid-open No. 9-235173 (KOKAI), as a method for cooling hot zone components after pulling a single crystal, a cooling time of the hot zone components is reduced by circulating an inert gas having an ordinary temperature or a lower temperature in a main chamber, thereby improving an operating rate of a single-crystal manufacturing apparatus.

However, a single crystal manufactured based on the technology of that time has a diameter of approximately 200 mm and a straight body length of approximately 70 cm, and a polycrystal raw material required for manufacture of the single crystal has a weight of approximately 200 kg, but the straight body length of the single crystal to be manufactured is increased at the present day for an improvement in pulling efficiency, and the weight of the required polycrystal raw material is also increased to approximately 300 kg.

As described above, the hot zone components including the crucible grow in size and heat capacities thereof also rise as an amount of the polycrystal raw material that is molten into a raw material melt increases.

Therefore, it cannot be said that adopting a method for circulating a gas having an ordinary temperature or a lower temperature in the chamber like Japanese Patent Application Laid-open No. 9-235173 (KOKAI) alone is sufficient to cool the hot zone components having increased heat capacities in a short time, and a further reduction in cooling time has been demanded.

DISCLOSURE OF INVENTION

The present invention was accomplished in order to solve the aforementioned problems, and its object is to provide a single-crystal manufacturing apparatus and a method for manufacturing a single crystal that enable a hot zone component in a main chamber to be cooled in a short time after pulling a single crystal having a large diameter, e.g., approximately 200 mm or above.

To achieve the above object, according to the present invention, there is provided a single-crystal manufacturing apparatus based on Czochralski method, comprising at least: a main chamber configured to accommodate hot zone components including a crucible; and a pull chamber configured to accommodate and take out a single crystal pulled from a raw material melt contained in the crucible, wherein the apparatus further comprises: a cooling pipe which is arranged above the crucible and in which a cooling medium is circulated; and a moving mechanism that moves up and down the cooling pipe, and the hot zone components are cooled down by utilizing the moving mechanism to move down the cooling pipe toward the crucible after growth of the single crystal.

Further, there is provided a method for manufacturing a single crystal based on Czochralski method, comprising at least: a step of melting a raw material put in a crucible; a step of growing a single crystal from the raw material melt and accommodating the single crystal in a pull chamber; and a step of cooling hot zone components in a main chamber including the crucible, wherein the step of cooling the hot zone components includes circulating a cooling medium in a cooling pipe arranged above the crucible and moving down the cooling pipe toward the crucible to cool the hot zone components.

As described above, according to the present invention, in case of cooling the hot zone components after growth of the single crystal based on Czochralski method, when the cooling medium is circulated in the cooling pipe arranged above the crucible, the cooling pipe is moved down toward the crucible and left as it is and the hot zone components are cooled by the radiation cooling. Accordingly, the hot zone components can be securely cooled and even a cooling time for the hot zone components after pulling the single crystal having a large diameter of, e.g., approximately 200 mm or above can be greatly reduced as compared with a conventional cooling method, e.g., natural cooling, cooling with a cooling cylinder for cooling a single crystal and cooling based on circulation of a gas having an ordinary temperature or a lower temperature in a main chamber. Therefore, the operating rate of the single-crystal manufacturing apparatus can be overwhelmingly improved, thus enhancing productivity of the single crystal.

In this case, it is preferable for the cooling pipe to be obtained by winding a jointless pipe into a ring-like shape for several turns and also preferable to use the cooling pipe obtained by winding a jointless pipe into a ring-like shape for several turns.

As described above, when the cooling pipe used for cooling the hot zone components is obtained by winding the jointless pipe for multiple turns into a ring-like shape, the cooling medium hardly leaks from the cooling pipe, and a possibility that the inside of the main chamber is contaminated with the cooling medium is reduced.

Furthermore, it is preferable for the pipe to be a copper pipe and also preferable to use the copper pipe as the pipe.

When the copper pipe is used as the pipe constituting the cooling pipe in this manner, since copper has good thermal conductivity, an atmosphere in the main chamber that is in contact with the cooling pipe can be rapidly cooled, and the hot zone components can be cooled in a short time.

Moreover, in the present invention, the cooling pipe can be installed in a cooling chamber that is replaceable with the pull chamber. At the step of cooling the hot zone components, the cooling chamber to which the cooling pipe is installed can be arranged above the main chamber by replacing the pull chamber, and the cooling pipe can be moved down toward the crucible.

As described above, the cooling pipe is installed in the cooling chamber that is replaceable with the pull chamber, and when this cooling chamber is arranged above the main chamber and the cooling pipe is moved down toward the crucible, there is no possibility of occurring obstructions of the single crystal pulling or a factor of contamination of the single crystal because of installing the cooling pipe in the chamber different from the pull chamber.

At this time, it is preferable for the cooling chamber to comprise a gas introduction opening from which a cooling gas is introduced and also preferable to circulate a cooling gas in the main chamber at the step of cooling the hot zone components.

When the gas introduction opening is provided to the cooling chamber that is replaceable with the pull chamber and the cooling gas is circulated in the main chamber in addition to cooling with the cooling pipe at the cooling step as described above, cooling of the hot zone components can be further accelerated.

Additionally, according to the present invention, it is preferable to dispose a heat exchanger configured to forcibly cool the cooling medium and also preferable to forcibly cool the cooling medium by the heat exchanger.

Since the cooling medium circulating in the cooling pipe absorbs heat emitted from the hot zone components when passing through the main chamber, forcibly cooling the warmed cooling medium by the heat exchanger enables further reducing the cooling time of the hot zone components even though the cooling medium is circulated, thus reducing a cost.

Further, it is preferable to move down the cooling pipe to enter the crucible at the step of cooling the hot zone components.

When the cooling pipe is moved down to enter the crucible at the time of cooling the hot zone components, a radiation cooling effect from the cooling pipe can be exercised at a maximum.

The single-crystal manufacturing apparatus and the method for manufacturing a single crystal according to the present invention enable powerfully cooling the hot zone components compared with a conventional cooling method, greatly reducing the time required for cooling the hot zone components having high heat capacities after pulling a single crystal having a large diameter, e.g., approximately 200 mm or above, improving an operating rate of the single-crystal manufacturing apparatus, and enhancing productivity of manufacture of the single crystal.

BEST MODE(S) FOR CARRYING OUT THE INVENTION

For example, when a single crystal to be grown has a straight body length of approximately 1 m and a diameter of approximately 200 mm, it is assumed that a growth time required for growing the single crystal is 24 hours. In manufacture of such a single crystal, a raw material polycrystal must be molten before growing the single crystal, and a time required for this step is approximately 12 hours. Further, after growing the single crystal, there are steps of cooling hot zone components installed in a main chamber, disassembling and cleaning the hot zone components and putting a raw material for growth of the next single crystal, and these steps requires a total of approximately 12 hours. In this period of time, cooling the hot zone components in natural cooling requires approximately 8 hours.

As described above, with an increase in diameter and in weight of the single crystal, an amount of the raw material polycrystal to be molten has been also increased. Therefore, since it is impossible to cope with an increase in heat capacities of the hot zone components by a conventional cooling method, a further reduction in cooling time has been demanded.

The present inventor has examined about a conventional method for cooling each hot zone component. Usually, after growth of the single crystal, hot zone components in a red-hot state (e.g., approximately 800° C. in case of a temperature of a crucible) are left until they are naturally cooled to approximately 50° C., or a cooling cylinder for cooling the single crystal during growth is continuously arranged above a quartz crucible even after the growth of the single crystal to facilitate cooling of the hot zone components. Furthermore, there is also a cooling method utilizing convection cooling, e.g., flowing a gas having an ordinary temperature or a lower temperature through a main chamber. However, all the methods are methods that are not active enough to drastically cool the hot zone components.

Thus, the present inventor has repeatedly and keenly conducted studies to discover a method for actively facilitating cooling of the hot zone components except the natural cooling or convection cooling method. As a result, the present inventor has conceived of an idea of facilitating a cooling rate of the hot zone components by installing radiation cooling means in hot zone and further gotten an ideal of cooling by circulating a cooling medium such as coolant water in a cooling pipe, moving down this cooling pipe to a portion where the hot zone components are gathered and arranging the cooling pipe near the hot zone components, thereby bringing the present invention to completion.

Hereinafter, embodiments according to the present invention will now be specifically described with reference to the drawings, but the present invention is not restricted thereto.

A single-crystal manufacturing apparatus according to the present invention will be first explained.

Figure 1:
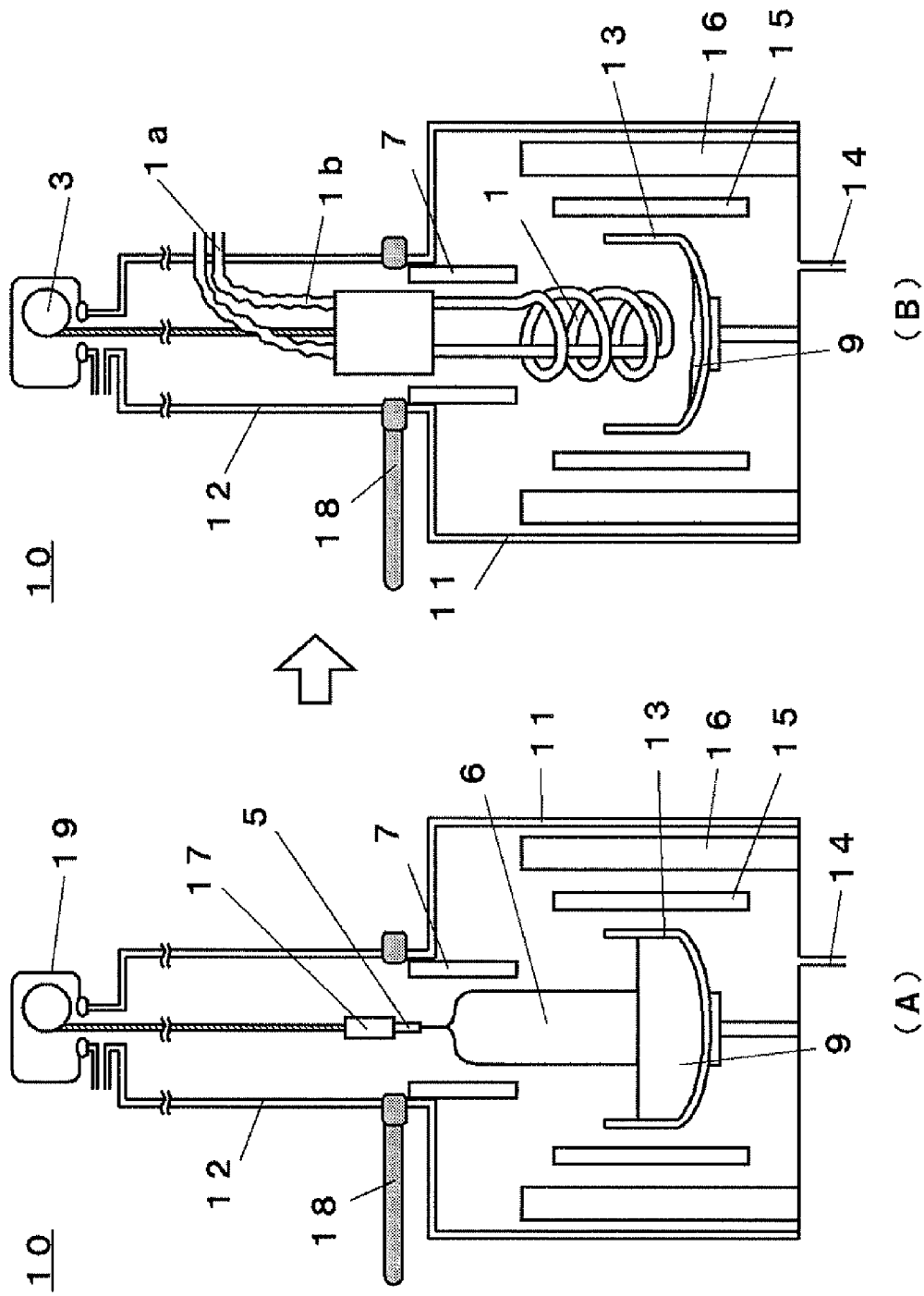
FIG. 1 are schematic views showing a first embodiment of a single-crystal manufacturing apparatus according to the present invention, where (A) shows the apparatus at the time of growing a single crystal and (B) shows the same at a step of cooling hot zone components.
Figure 2:
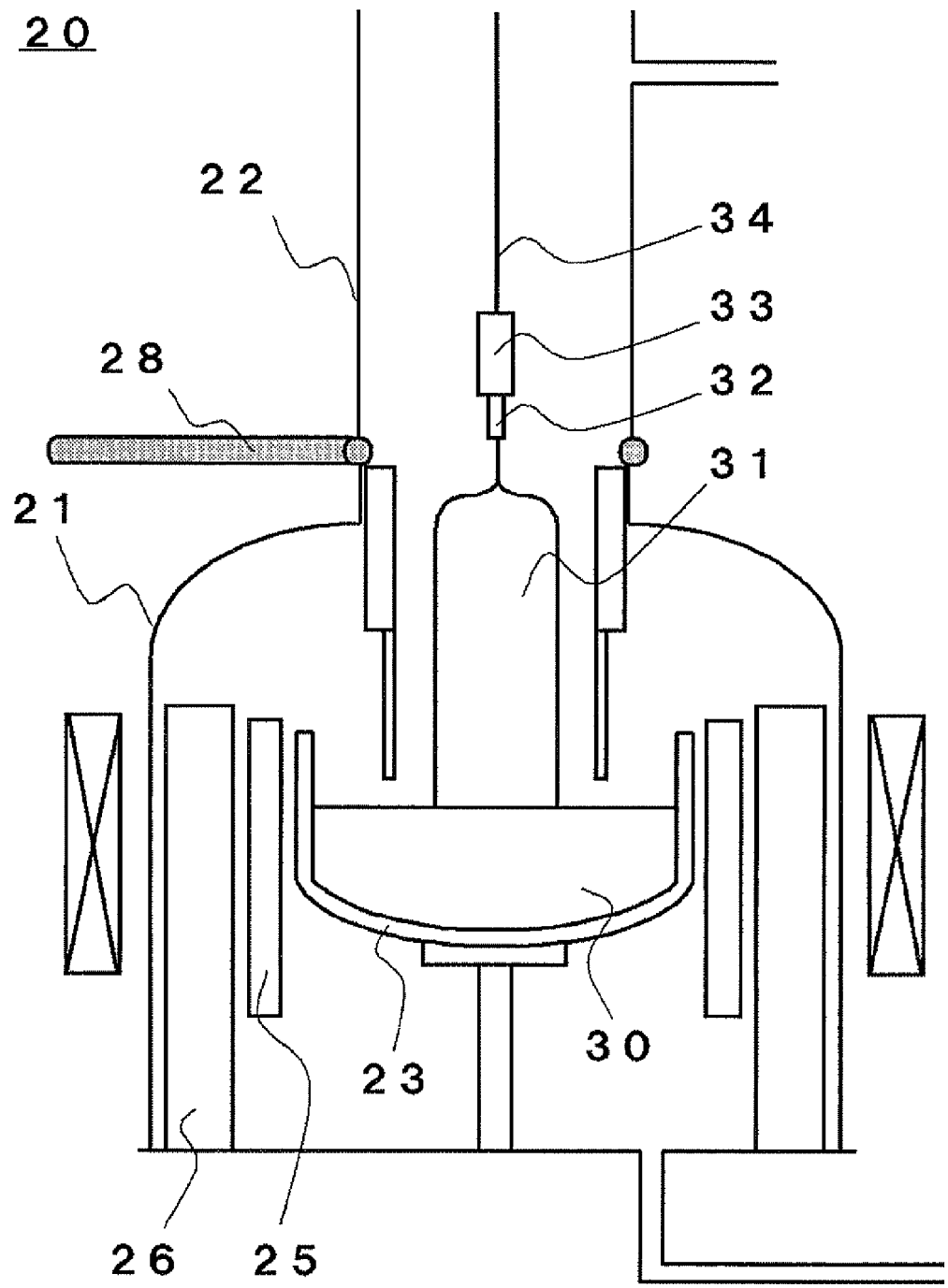
FIG. 2 is a schematic view showing a general single-crystal manufacturing apparatus used in CZ method.

FIG. 1 are schematic views showing a first embodiment of a single-crystal manufacturing apparatus according to the present invention, where FIG. 1(A) shows the apparatus at the time of growing a single crystal and FIG. 1(B) shows the same at the time of cooling hot zone components.

This single-crystal manufacturing apparatus 10 is used in Czochralski method and generally includes a main chamber 11 and a pull chamber 12, and a gate valve 18 that serves as a lid for opening/closing an opening portion at an upper end of the main chamber 11 is provided between these chambers.

The main chamber 11 is configured to accommodate a crucible 13 containing a raw material melt 9 obtained by melting a polycrystal raw material, a heater 15 that is provided around the crucible 13 to melt the raw material polycrystal and maintain a temperature of the raw material melt, and a heat insulating material 16 that is provided around the heater 15 to shield against heat emitted from the heater and protect the main chamber 11 as shown in FIG. 1(A).

In particular, an area having a high temperature due to heat radiation from the heater during growth of a single crystal is called hot zone, a component that becomes a red-hot state in hot zone is called a hot zone component, and representatives of the hot zone component are, e.g., the crucible 13, the heater 15 and the heat insulating material 16.

The pull chamber 12 is a chamber configured to accommodate and take out a single crystal 6 pulled from the raw material melt 9 contained in the crucible 13.

A single-crystal pulling mechanism 19 including a wire is arranged above this pull chamber 12, and a seed crystal 5 can be held at an end of the pulling mechanism 19 by using a seed crystal holder 17.

Further, the single-crystal manufacturing apparatus 10 further includes a cooling pipe 1 in which a cooling medium is circulated and which is arranged above the crucible 13 and a moving mechanism 3 that moves up and down the cooling pipe 1 as shown in FIG. 1(B).

To enable vertical movement of the cooling pipe 1 by using the moving mechanism 3, for example, the cooling pipe can be moved up and down by connecting a pipe 1a communicating with the inside from the outside of the pull chamber 12 to the cooling pipe 1 through a flexible tube 1b.

It is to be noted that the moving mechanism 3 that moves up and down the cooling pipe can also function as the pulling mechanism 19 that pulls the single crystal.

In regard to an operation of such a single-crystal manufacturing apparatus 10, after growth of the single crystal, the pulled single crystal 6 and the cooling pipe 1 are replaced, the cooling medium circulates in the cooling pipe 1, the cooling pipe 1 is moved down toward the crucible 13 and stops above the remaining raw material melt by the moving mechanism 3, and cooling is started. Of course, this cooling pipe 1 and the moving mechanism 3 may be installed in the pull chamber in advance.

When the cooling means for the hot zone components is further installed in the single-crystal manufacturing apparatus in this manner, the hot zone components can be securely cooled by a radiation cooling effect of the cooling pipe arranged in hot zone and even a cooling time of the hot zone components after pulling the single crystal having a large diameter of, e.g., approximately 200 mm or above can be greatly reduced as compared with a conventional cooling method such as natural cooling, cooling using a cooling cylinder for cooling a single crystal and cooling based on circulation of a gas having an ordinary temperature or a lower temperature in the main chamber. Therefore, an operating rate of the single-crystal manufacturing apparatus can be overwhelmingly improved, thus enhancing productivity of the single crystal.

Furthermore, in the single-crystal apparatus 10, it is preferable for the cooling pipe 1 to be obtained by winding a jointless pipe into a ring-like form for several turns.

When the cooling pipe used for cooling the hot zone components is obtained by winding the jointless pipe into the ring-like form for several turns, the cooling medium hardly leaks from the cooling pipe, and a possibility that the inside of the main chamber is contaminated with the cooling medium is reduced.

Moreover, it is preferable for the pipe of the cooling pipe 1 to be formed of a copper pipe. When a material of the cooling pipe is copper in this manner, the cooling pipe having excellent thermal conductivity can be provided, a heat removal effect can be improved, and an atmosphere in the main chamber that is in contact with the cooling pipe can be rapidly cooled down.

It is to be noted that the cooling medium circulated in the cooling pipe is not restricted in particular, and it may be coolant water such as pure water. Additionally, to forcibly cool this cooling medium to further facilitate cooling the hot zone components, installing a heat exchanger (not shown) in the single-crystal manufacturing apparatus is preferable. When the cooling medium can be forcibly cooled through the cooling pipe by the heat exchanger installed in the single-crystal manufacturing apparatus in this manner, a cooling effect can be maintained during the cooling step even though the cooling medium is circulated to repeatedly pass through hot zone. Therefore, a total used amount of the coolant water can be reduced, which is advantageous for a cost.

Figure 4:
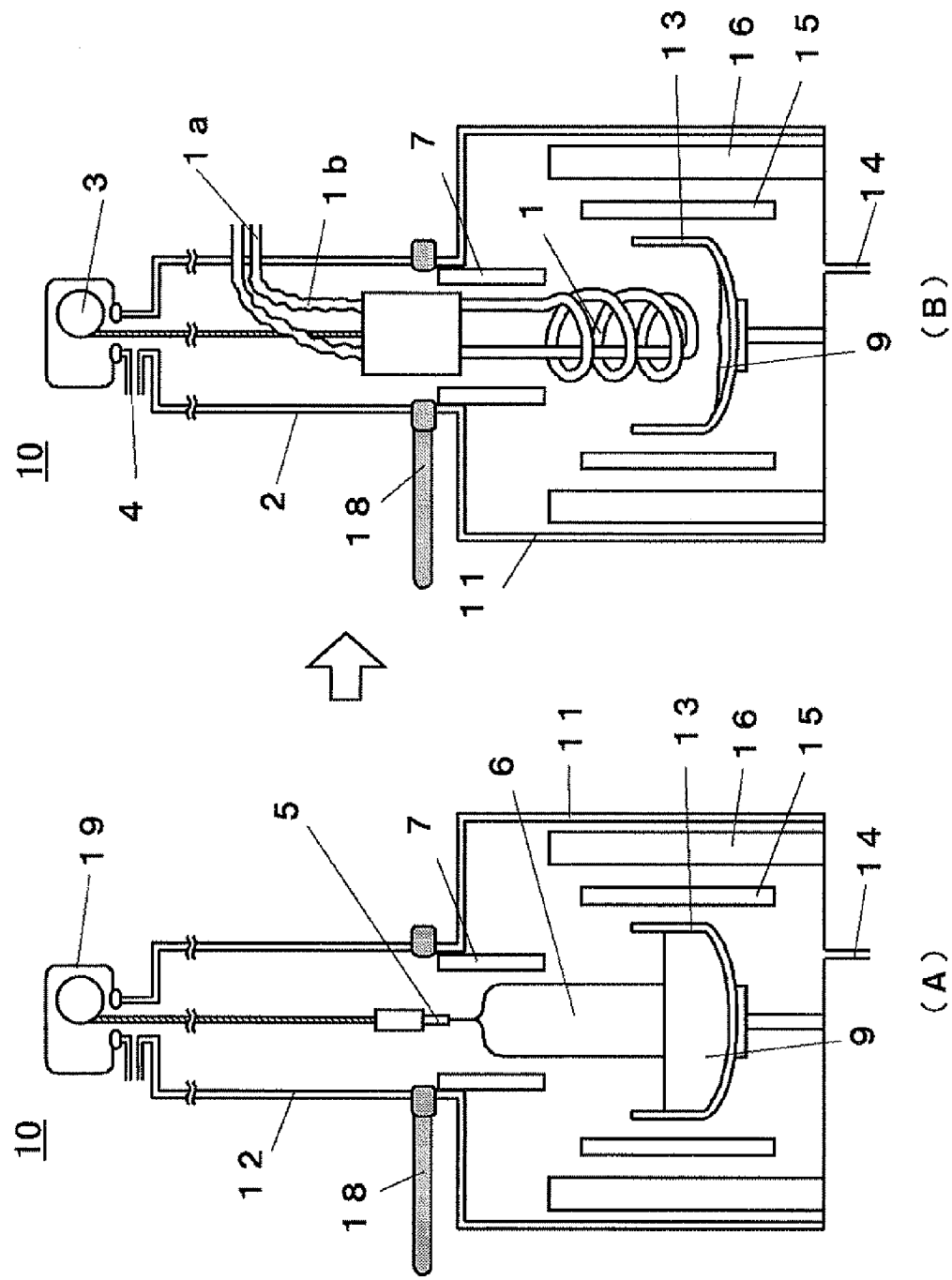
FIG. 4 are schematic views showing a second embodiment of the single-crystal manufacturing apparatus according to the present invention, where (A) shows the apparatus at the time of growing a single crystal and (B) shows the same at a step of cooling hot zone components.

Further, the cooling pipe 1 may be installed in a cooling chamber 2 that can be replaced with the pull chamber 12 as shown in FIG. 4.

FIG. 4 are schematic views showing a second embodiment of a single-crystal manufacturing apparatus according to the present invention. FIG. 4(A) shows the apparatus at the time of growth of a single crystal, and FIG. 4(B) shows the same at the time of cooling hot zone components. Furthermore, FIG. 5 are plane views of FIG. 4, and FIG. 5(A) and FIG. 5(B) are associated with FIG. 4(A) and FIG. 4(B), respectively.

Figure 5:
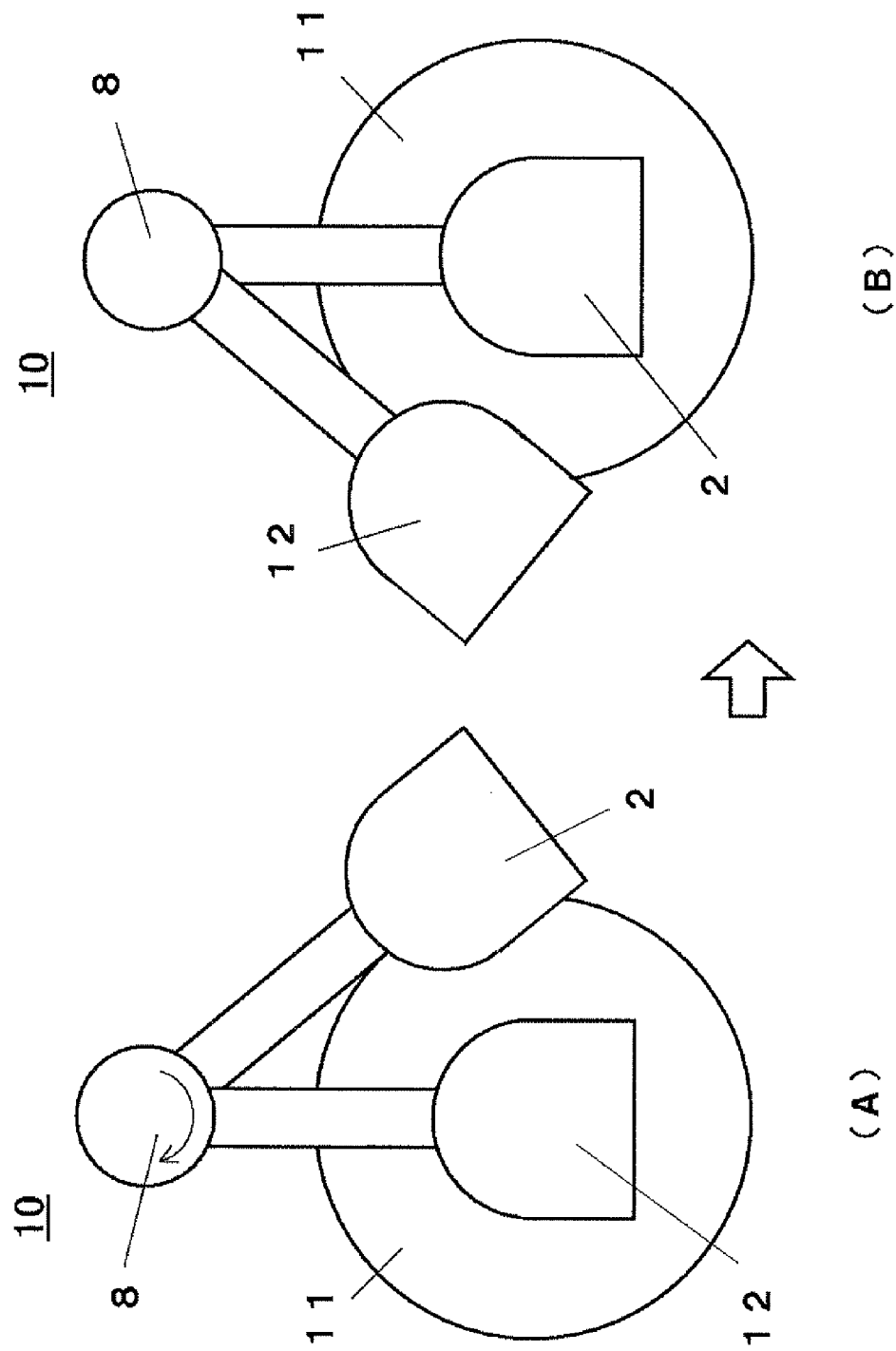
FIG. 5 are plane views of FIG. 4, where (A) and (B) are views associated with FIG. 4(A) and FIG. 4(B), respectively.

As shown in FIG. 4 and FIG. 5, in the second embodiment according to the present invention, a single-crystal manufacturing apparatus 10 includes a cooling chamber 2 different from the pull chamber 12, and a cooling pipe 1 is installed in the cooling chamber 2. This pull chamber 12 and the cooling chamber 2 can be driven by, e.g., a hydraulic unit 8.

As a result, after growth of the single crystal, a cooling step can be carried out by a simple operation, i.e., closing a gate valve 18 to prevent a main chamber 11 from coming into contact with outside air, counterchanging the pull chamber and the cooling chamber, opening the gate valve, and moving down the cooling pipe.

Furthermore, since the cooling pipe 1 is not installed in the pull chamber 12, the cooling pipe does not become an obstacle during pulling of the single crystal, and the grown single crystal is not contaminated. Moreover, a troublesome operation, i.e., replacing the grown single crystal and the cooling pipe can be omitted.

Additionally, a moving mechanism 3 is installed to this cooling chamber 2 to enable moving up and down the cooling pipe 1. Further, it is preferable to form a gas introduction opening 4 from which a cooling gas is introduced. When the gas introduction opening 4 is formed to the cooling chamber 2 including the cooling pipe 1 in this manner, a convection cooling effect obtained by the cooling gas introduced from the gas introduction opening 4 can be expected in addition to a radiation cooling effect for hot zone components obtained by the cooling pipe 1. Therefore, cooling of the hot zone components can be further accelerated. It is to be noted that a gas discharge opening 14 from which the introduced gas is discharged is provided to a bottom portion of the main chamber.

Next, a method for manufacturing a single crystal by using the above-described single-crystal manufacturing apparatus will now be explained hereinafter.

First, in the single-crystal manufacturing apparatus 10 depicted in FIG. 1, a raw material polycrystal is put into the crucible 13, and the raw material polycrystal is molten by the heater 15 to obtain the raw material melt 9. Although depending on meltage of the raw material polycrystal, for example, in case of a diameter of approximately 200 mm and a straight body length of approximately 1 m, approximately 300 kg of the raw material polycrystal is used.

Then, as shown in FIG. 1(A), a seed crystal 5 is brought into contact with the molten raw material melt 9 to grow the single crystal 6 based on Czochralski method. At this moment, the single crystal 6 in a growth process is cooled down by a cooling cylinder 7 while being moved to be accommodated in the pull chamber 12 from the main chamber 11. Furthermore, the single crystal 6 having a desired length is completely accommodated in the pull chamber 12, the gate valve 18 is closed to hermetically seal the main chamber 11, and the grown single crystal 6 is taken out from the pull chamber 12.

Subsequently, the cooling pipe 1 is installed in the pull chamber 12, and the cooling medium is circulated in the cooling pipe 1 arranged above the crucible 13. At this time, the cooling pipe 1 is connected through the flexible tube 1b to the pipe 1a communicating with the inside from the outside of the pull chamber 12, and it can be moved up and down by the moving mechanism 3.

Moreover, the cooling pipe 1 is moved down toward the crucible 13 by the moving mechanism 3 to cool the hot zone components in the main chamber 11.

As described above, in case of cooling the hot zone components after growing the single crystal based on Czochralski method, when the cooling medium is circulated in the cooling pipe arranged above the crucible, the cooling pipe is moved down toward the crucible and left as it is and the hot zone components are cooled down by radiation cooling, the hot zone components can be securely cooled and even a cooling time of the hot zone components after pulling the single crystal having a large diameter, e.g., approximately 200 mm or above can be greatly reduced as compared with conventional methods, e.g., natural cooling, cooling with a cooling cylinder for cooling a single crystal and cooling based on circulation of a gas having an ordinary temperature or a lower temperature in the main chamber. Therefore, an operating rate of the single-crystal manufacturing apparatus can be overwhelmingly improved, and productivity of the single crystal is enhanced.

At this time, it is preferable to use the cooling pipe 1 obtained by winding a jointless pipe into a ring-like shape for several turns.

When the cooling pipe for cooling the hot zone components that is obtained by winding the jointless pipe into the ring-like shape for several turns is used as described above, the cooling medium hardly leaks from the cooling pipe, and a possibility that the inside of the main chamber is contaminated with the cooling medium is reduced.

Additionally, when a copper pipe is used as the pipe, thermal conductivity of the cooling pipe becomes excellent, and a heat removal effect can be improved to efficiently perform radiation cooling with respect to the atmosphere in the main chamber that is in contact with the cooling pipe, thereby cooling the hot zone components in a short time.

Further, when such a cooling pipe 1 is moved down by using the moving mechanism 3, it is preferable to move down the cooling pipe to enter the crucible 13 as shown in FIG. 1(B).

When the cooling pipe is moved down to enter the crucible at the time of cooling the hot zone components in this manner, the radiation cooling effect from the cooling pipe can be exercised at a maximum.

Furthermore, when facilitating cooling of the hot zone components is desired, the cooling effect obtained by the cooling medium can be maintained during the cooling step no matter how many times the cooling medium passes through hot zone by using the heat exchanger to forcibly cool the cooling medium flowing in the cooling pipe while being circulated, and this configuration is also advantageous in terms of cost.

A cooling step when the pull chamber and the cooling chamber are counterchanged as shown in FIGS. 4 and 5 will now be described.

When the cooling pipe is installed in the new cooling chamber without being disposed in the pull chamber, after growth of the single crystal, the gate valve 18 is closed, and the single crystal 6 accommodated in the pull chamber 12 is taken out. Moreover, as shown in FIG. 5, the hydraulic unit 8 is utilized to remove the pull chamber 12 from above the main chamber 11, the cooling chamber 2 is swung to the position where the pull chamber 12 has been mounted, and the cooling chamber 2 is arranged above the main chamber 11 to be replaced with the pull chamber, thereby disposing the cooling pipe 1 above the crucible 13 (see FIG. 5).

Then, the cooling pipe 1 is moved down toward the crucible 13 by using the moving mechanism 3.

When the cooling chamber is replaced with the pull chamber above the main chamber in this manner, the cooling pipe can be easily arranged above the crucible. Additionally, since the cooling pipe 1 is not installed in the pull chamber 12, the cooling pipe does not obstruct pulling of the single crystal and the grown single crystal is not contaminated.

Furthermore, to facilitate cooling of the hot zone components, it is preferable to circulate the cooling gas in the main chamber 11 from the gas introduction opening 4 provided to the cooling chamber that can be replaced with the pull chamber. In addition to such radiation cooling using the cooling pipe, combining convection cooling using the cooling gas enables further accelerating cooling of the hot zone components. The convection cooling using the cooling gas can be naturally carried out in addition to the radiation cooling even though such a cooling chamber as depicted in FIG. 1 is not provided, and the effect can be exercised.

It is to be noted that the cooling gas introduced from the gas introduction opening 4 is discharged from the gas discharge opening 14 provided to the bottom portion of the main chamber 11 in the single-crystal manufacturing apparatus. Further, a type of the cooling gas is not restricted in particular as long as it is a gas which does not contaminate the inside of the single-crystal manufacturing apparatus, the same gas as that circulated during growth of the single crystal can be utilized for instance. For example, as an available gas, there is an argon gas or a nitrogen gas which is an inert gas. A gas to be introduced may be cooled to a room temperature or a lower temperature.

When the same gas as that utilized during growth of the single crystal is adopted, troublesome preparation of the cooling gas or installation of an additional device can be omitted.

Moreover, at the cooling step, since the raw material melt is rapidly solidified even though the copper cooling pipe 1 comes into contact with the raw material melt 9 remaining in the crucible 13, it does not react with the copper cooling pipe 1.

Additionally, when cooling of the hot zone components is finished, the cooling pipe 1 is moved up by the moving mechanism 3, the hot zone components are cleaned and replaced, the raw material is put into the crucible, and the processing returns to a raw material polycrystal melting step. When the cooling chamber is used at the cooling step, it is replaced with the pull chamber to start growth of the next single crystal.

It is to be noted that, to increase the cooling effect, a freezing machine may be combined with an antifreeze liquid to cool down the cooling medium circulating in the cooling pipe, thereby facilitating cooling of the hot zone components.

The present invention will now be described hereinafter in more detail in conjunction with examples of the present invention, but these examples do not restrict the present invention.

EXAMPLE 1

In the single-crystal manufacturing apparatus 10 shown in FIG. 1 according to the present invention, a cooling time for hot zone components was measured as follows.

As a crucible in the single-crystal manufacturing apparatus used in this Example 1, a crucible having a diameter of approximately 600 mm for pulling a single crystal having a diameter of 200 mm was utilized. Furthermore, a quartz crucible of this size was utilized to melt a raw material polycrystal for 12 hours, and a single crystal having a diameter of approximately 200 mm and a straight body length of approximately 1 m was grown for 24 hours. After end of growth of the single crystal, a heater was turned off, the crystal was taken out from a pull chamber, then a temperature of a graphite crucible that supports the quartz crucible was measured, and a result was approximately 800° C.

Then, coolant water having a temperature of approximately 20° C. was circulated in a cooling pipe, and the cooling pipe was moved down to a position which is immediately above the raw material melt remaining in the crucible and at which the cooling pipe scarcely touches the raw material melt to perform radiation cooling with respect to the hot zone components. At this time, cooling with a cooling cylinder for cooling the single crystal was continued.

Figure 3:
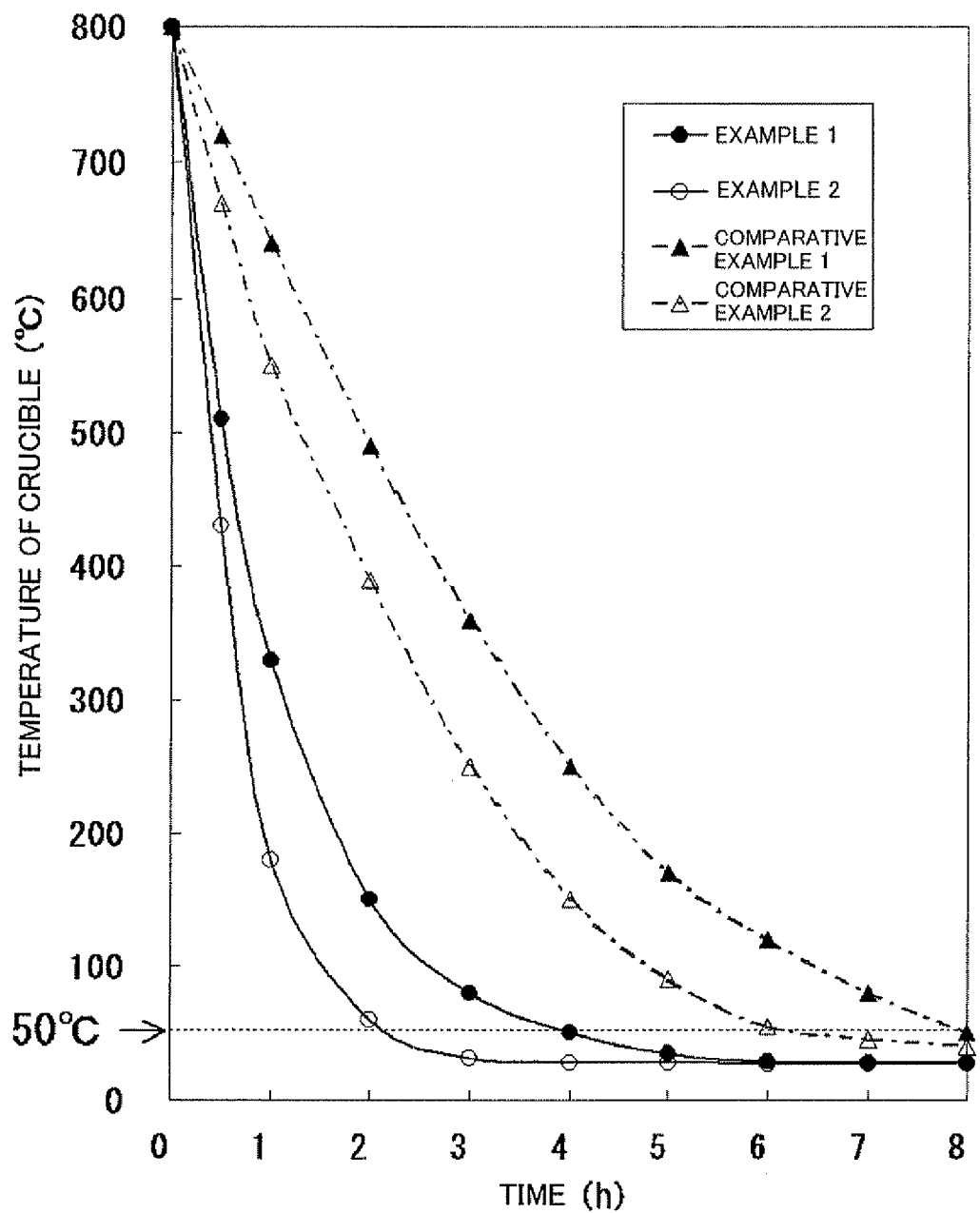
FIG. 3 is a view showing a result of measuring a temperature of a crucible which is a hot zone component in each of examples and comparative examples.

FIG. 3 shows a result of measuring a temperature of the graphite crucible 13 which is a representative of the hot zone components.

As a result, the temperature of the crucible reached approximately 50° C. in approximately 4 hours, and cooling of the hot zone components was successfully finished.

EXAMPLE 2

In regard to a melting time and meltage of a raw material, a diameter and a length of a straight body of a grown single crystal, and a growth time, the same conditions as those in Example 1 were used.

Then, coolant water having a temperature of approximately 20° C. was circulated in a cooling pipe, the cooling pipe was moved down to a position which is immediately above a raw material melt remaining in a crucible and at which the cooling pipe scarcely touches the raw material melt, and an argon gas having an ordinary temperature was circulated from a gas introduction opening. Accordingly, radiation cooling using the cooling pipe was combined with convection cooling using a cooling gas to cool down hot zone components. The same single-crystal manufacturing apparatus as that in Example 1 was used, and cooling using a cooling cylinder for cooling the single crystal was continued.

FIG. 3 shows a result of measuring a temperature of a graphite crucible 13 as a representative of the hot zone components.

As a result, the temperature of the crucible reached approximately 50° C. in about 2 hours, and cooling of the hot zone components was successfully finished.

COMPARATIVE EXAMPLE 1

For comparison, in regard to a melting time and meltage of a raw material, a diameter and a length of a straight body of a grown single crystal, and a growth time, the same conditions as those in Example 1 were used.

Then, natural cooling was performed with respect to hot zone components under the same conditions as those in Example 1 except that a cooling pipe was not used, a cooling gas was not circulated and cooling using a cooling cylinder for cooling the single crystal was stopped.

FIG. 3 shows a result of measuring a temperature of a graphite crucible which is a representative of the hot zone components.

As a result, the temperature of the crucible reached approximately 50° C. in about 8 hours, and cooling of the hot zone components was finished.

COMPARATIVE EXAMPLE 2

For comparison, in regard to a melting time and meltage of a raw material, a diameter and a length of a straight body of a grown single crystal, and a growth time, the same conditions as those in Example 1 were used.

Then, hot zone components were cooled under the same conditions as those in Example 1 except that a cooling pipe was not utilized. That is, cooling using a cooling cylinder for cooling the single crystal alone was carried out.

FIG. 3 shows a result of measuring a temperature of a graphite crucible which is a representative of the hot zone components.

As a result, the temperature of the crucible reached approximately 50° C. in about 6 hours, and cooling of the hot zone components was finished.

Based on the results of Examples 1 and 2 and Comparative Examples 1 and 2, a total operation time in conventional examples is 24 hours for growth of the single crystal+8 hours as the cooling time (natural cooling) for the hot zone components+4 hours for cleaning, replacement and putting the raw material+12 hours for melting the raw material=48 hours. The cooling of the hot zone components can be shorten to 4 hours by adopting the cooling method according to Example 1, i.e., radiation cooling using the cooling pipe, and the cooling of the hot zone components can be shorten to 2 hours by the cooling method according to Example 2, i.e., a combination of the radiation cooling using the cooling pipe and the convection cooling using the cooling gas. Therefore, the total operation time can be reduced 8 to 10% to constrict a production cost.

It is to be noted that the present invention is not restricted to the foregoing embodiments. The foregoing embodiments are just exemplifications, and any examples that have substantially the same configurations and exercise the same functions and effects as the technical concept described in claims of the present invention are included in the technical concept of the present invention.

The invention claimed is:

1. A single-crystal manufacturing apparatus based on Czochralski method, comprising at least:
   a main chamber configured to accommodate hot zone components including a crucible, and
   a pull chamber configured to accommodate and take out a single crystal pulled from a raw material melt contained in the crucible; wherein
      the apparatus further comprises: a cooling pipe which is arranged above the crucible and in which a cooling medium is circulated, and a moving mechanism that moves up and down the cooling pipe;
      the cooling pipe is installed in a cooling chamber that is replaceable with the pull chamber; and
      the hot zone components are cooled down by utilizing the moving mechanism to move down the cooling pipe toward the crucible after growth of the single crystal.

2. The single-crystal manufacturing apparatus according to claim 1, wherein the cooling pipe is obtained by winding a jointless pipe into a ring-like shape for several turns.

3. The single-crystal manufacturing apparatus according to claim 2, wherein the pipe is a copper pipe.

4. The single-crystal manufacturing apparatus according to claim 1, wherein the cooling chamber comprises a gas introduction opening from which a cooling gas is introduced.

5. The single-crystal manufacturing apparatus according to claim 1, wherein a heat exchanger configured to forcibly cool the cooling medium is disposed.

6. A method for manufacturing a single crystal based on Czochralski method, comprising at least:
   a step of melting a raw material put in a crucible;
   a step of growing a single crystal from the raw material melt and accommodating the single crystal in a pull chamber; and
   a step of cooling hot zone components in a main chamber including the crucible, wherein
      at the step of cooling the hot zone components, a cooling chamber to which the cooling pipe is installed is arranged above the main chamber by replacing the pull chamber; and
      the step of cooling the hot zone components includes circulating a cooling medium in a cooling pipe arranged above the crucible and moving down the cooling pipe toward the crucible to cool the hot zone components.

7. The method for manufacturing a single crystal according to claim 6, wherein the cooling pipe obtained by winding a jointless pipe into a ring-like shape for several turns is used.

8. The method for manufacturing a single crystal according to claim 7, wherein a copper pipe is used as the pipe.

9. The method for manufacturing a single crystal according to claim 6, wherein, at the step of cooling the hot zone components, a cooling gas is circulated in the main chamber.

10. The method for manufacturing a single crystal according to claim 6, wherein the cooling medium is forcibly cooled by a heat exchanger.

11. The method for manufacturing a single crystal according to claim 6, wherein, at the step of cooling the hot zone components, the cooling pipe is moved down to enter the crucible.

* * * * *